(12) United States Patent
Shinohara et al.

(10) Patent No.: US 8,970,769 B2
(45) Date of Patent: Mar. 3, 2015

(54) SOLID-STATE IMAGING APPARATUS, METHOD OF MANUFACTURING THE SAME, AND CAMERA

(71) Applicant: Canon Kabushiki Kaisha, Tokyo (JP)

(72) Inventors: Mahito Shinohara, Tokyo (JP); Masatsugu Itahashi, Yokohama (JP); Hideomi Kumano, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/046,474

(22) Filed: Oct. 4, 2013

(65) Prior Publication Data

US 2014/0118602 A1     May 1, 2014

(30) Foreign Application Priority Data

Oct. 26, 2012  (JP) ................. 2012-237270

(51) Int. Cl.

| H04N 5/225 | (2006.01) |
|---|---|
| G02B 13/16 | (2006.01) |
| H04N 9/07 | (2006.01) |
| H04N 9/083 | (2006.01) |
| H04N 3/14 | (2006.01) |
| H04N 5/335 | (2011.01) |
| H04N 9/04 | (2006.01) |
| H01L 31/0232 | (2014.01) |
| H01L 31/00 | (2006.01) |
| H01L 21/00 | (2006.01) |
| H01L 27/146 | (2006.01) |

(52) U.S. Cl.
CPC .... *H01L 27/14629* (2013.01); *H01L 27/14685* (2013.01); *H01L 27/1462* (2013.01); *H01L 27/1464* (2013.01)

USPC .......... 348/340; 348/335; 348/266; 348/272; 257/432; 257/440; 438/69

(58) Field of Classification Search
CPC ................ H01L 27/14685; H01L 31/02168; H01L 31/02162; H04N 5/2254; G02B 5/22; G02B 5/26; G02B 5/28
USPC .......... 348/335–340, 266, 272; 257/432, 440, 257/436, 437, 431, 464; 438/69
See application file for complete search history.

(56) References Cited

U.S. PATENT DOCUMENTS

| 8,013,409 B2 | 9/2011 | Itahashi |
|---|---|---|
| 8,139,133 B2 | 3/2012 | Iwane et al. |

(Continued)

FOREIGN PATENT DOCUMENTS

JP        2006-261372 A        9/2006

*Primary Examiner* — Chia-Wei A Chen

(74) *Attorney, Agent, or Firm* — Fitzpatrick, Cella, Harper & Scinto

(57) ABSTRACT

A solid-state imaging apparatus comprising a substrate having a first face and a second face opposing each other, and in which photoelectric conversion portions are formed, an optical system including microlenses provided on a side of the first face, and light absorbing portions provided on a side of the second face, wherein the apparatus has pixels of first type for detecting light of a first wavelength and second type for detecting light of a second wavelength shorter than the first wavelength, and the apparatus further comprises a first portion between the substrate and the light absorbing portion for each first type pixel, and a second portion between the substrate and the light absorbing portion for each second type pixel, and the first portion has a reflectance higher than that of the second portion for the light of the first wavelength.

6 Claims, 3 Drawing Sheets

(56) References Cited

U.S. PATENT DOCUMENTS

| | | |
|---|---|---|
| 8,164,668 B2 | 4/2012 | Iida et al. |
| 8,426,794 B2 | 4/2013 | Itahashi |
| 8,546,173 B2 | 10/2013 | Itahashi |
| 2005/0122417 A1* | 6/2005 | Suzuki .................... 348/340 |
| 2007/0030380 A1* | 2/2007 | Higuchi et al. ............. 348/340 |
| 2007/0285555 A1* | 12/2007 | Chen ...................... 348/340 |
| 2008/0265349 A1* | 10/2008 | Kasano et al. ............. 257/432 |
| 2009/0039340 A1* | 2/2009 | Toda ...................... 257/21 |
| 2009/0104729 A1* | 4/2009 | Koizumi et al. ............ 438/69 |
| 2010/0167441 A1* | 7/2010 | Ray et al. ................. 438/29 |
| 2010/0221864 A1* | 9/2010 | Koizumi et al. ............ 438/69 |
| 2010/0314544 A1* | 12/2010 | Ouvrier-Buffet ......... 250/338.4 |
| 2011/0095389 A1* | 4/2011 | Cui et al. ................. 257/432 |
| 2011/0177648 A1* | 7/2011 | Tanner et al. .............. 438/72 |
| 2011/0201144 A1* | 8/2011 | Toda ...................... 438/69 |
| 2011/0241145 A1* | 10/2011 | Lenchenkov ............... 257/432 |
| 2011/0285892 A1 | 11/2011 | Itahashi |
| 2012/0070935 A1* | 3/2012 | Myong ..................... 438/69 |
| 2012/0077300 A1* | 3/2012 | Hashimoto ................. 438/69 |
| 2012/0154650 A1 | 6/2012 | Shinohara |
| 2012/0287297 A1* | 11/2012 | Fukuda .................... 348/222.1 |
| 2013/0032915 A1* | 2/2013 | Tonotani et al. ............ 257/432 |
| 2013/0037902 A1* | 2/2013 | Nakazawa et al. .......... 257/432 |
| 2013/0082165 A1* | 4/2013 | Ootsuka et al. ............ 250/208.1 |
| 2013/0082343 A1 | 4/2013 | Fudaba et al. |
| 2013/0135519 A1* | 5/2013 | Katsuda et al. ............. 348/345 |
| 2013/0140432 A1* | 6/2013 | Bikumandla .............. 250/208.1 |
| 2013/0153767 A1* | 6/2013 | Savoy et al. ............... 250/338.1 |
| 2013/0155311 A1* | 6/2013 | Grandin et al. ............. 348/335 |
| 2013/0181113 A1* | 7/2013 | Egawa .................... 250/208.1 |
| 2013/0240708 A1* | 9/2013 | Kokubun ................. 250/208.1 |
| 2014/0034957 A1* | 2/2014 | Kraus et al. ............... 257/76 |

* cited by examiner

US 8,970,769 B2

SOLID-STATE IMAGING APPARATUS, METHOD OF MANUFACTURING THE SAME, AND CAMERA

BACKGROUND OF THE INVENTION

1. Field of the Invention

The present invention relates to a solid-state imaging apparatus, a method of manufacturing the same, and a camera.

2. Description of the Related Art

In a back-side illumination solid-state imaging apparatus, a substrate on which photoelectric conversion portions are provided has a thickness of, for example, about 3 µm, and long-wavelength components (for example, green or red light) of incident light are transmitted to the surface side.

Japanese Patent Laid-Open No. 2006-261372 discloses a structure in which a reflective film 140 is arranged to cover a substrate (device layer 110) including photoelectric conversion elements 111. In the structure described in Japanese Patent Laid-Open No. 2006-261372, light transmitted through the substrate is reflected by the reflective film 140, and undergoes photoelectric conversion by the photoelectric conversion elements 111, resulting in improvement of light sensitivity.

In the structure described in Japanese Patent Laid-Open No. 2006-261372, light transmitted through the substrate is uniformly reflected by the reflective film 140 toward the photoelectric conversion elements 111. That is, for example, if green or red light mixes in a pixel (blue pixel) which should detect blue light, the green or red light is unwantedly detected in the blue pixel. This may decrease the quality of an image to be obtained.

SUMMARY OF THE INVENTION

The present invention is advantageous in preventing color mixing between adjacent pixels in a solid-state imaging apparatus.

One of the aspects of the present invention provides a solid-state imaging apparatus having a plurality of pixels, comprising a substrate which has a first face and a second face opposite to the first face, and in which a plurality of photoelectric conversion portions respectively corresponding to the plurality of pixels are formed, an optical system which includes a plurality of microlenses provided on a side of the first face of the substrate in correspondence with the plurality of pixels, and a plurality of light absorbing portions which are provided on a side of the second face of the substrate in correspondence with the plurality of pixels and absorb light, wherein the plurality of pixels include pixels of a first type for detecting light of a first wavelength and pixels of a second type for detecting light of a second wavelength shorter than the first wavelength, and the solid-state imaging apparatus further comprises, for each of the pixels of the first type, a first portion between the substrate and the light absorbing portion corresponding to the pixel, and further comprises, for each of the pixels of the second type, a second portion between the substrate and the light absorbing portion corresponding to the pixel, and the first portion has a reflectance higher than that of the second portion for the light of the first wavelength.

Further features of the present invention will become apparent from the following description of exemplary embodiments with reference to the attached drawings.

DESCRIPTION OF THE EMBODIMENTS

First Embodiment

Figure 1:
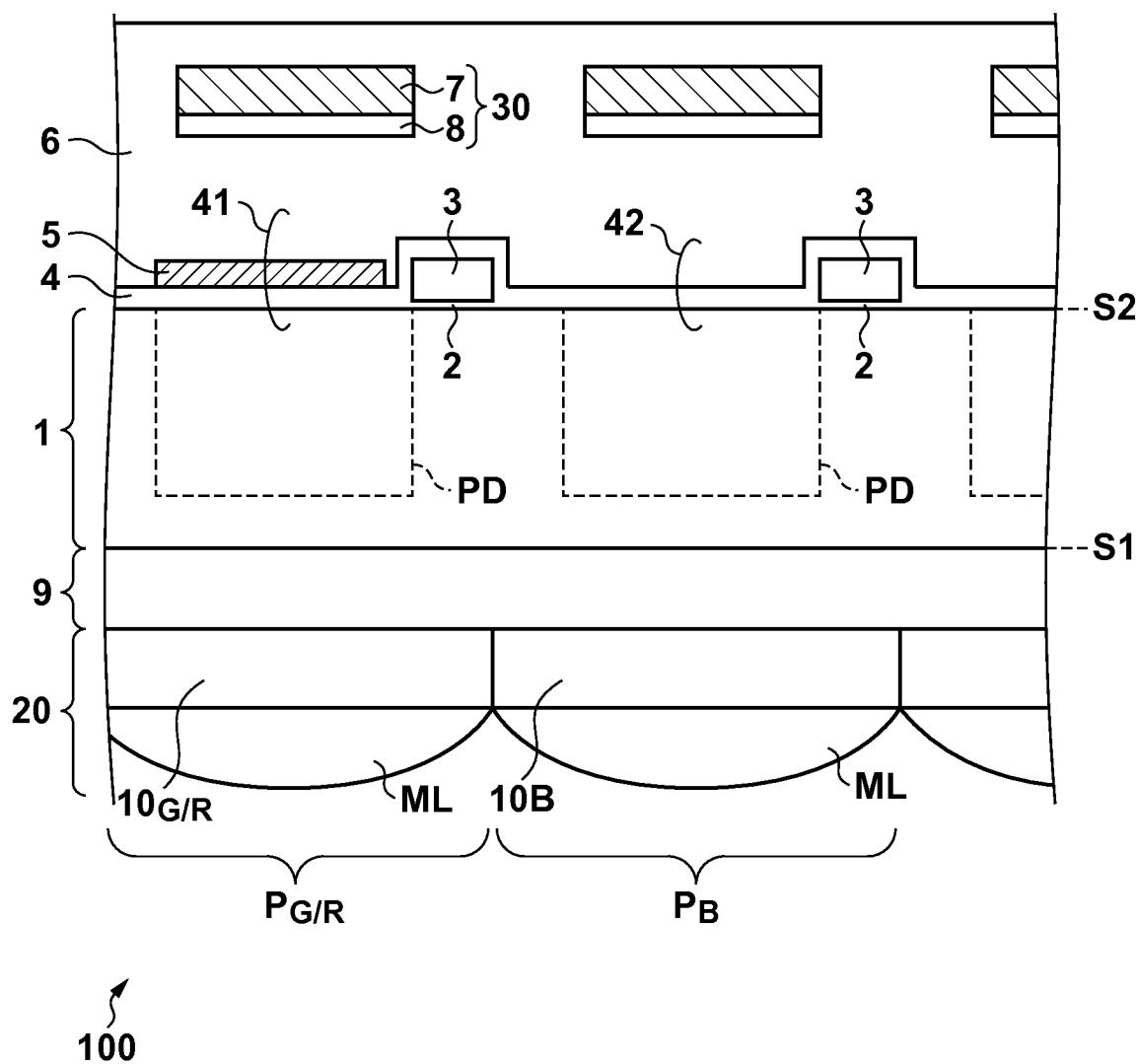
FIG. 1 is a view for explaining an example of the arrangement of a solid-state imaging apparatus according to the first embodiment.

A solid-state imaging apparatus 100 according to the first embodiment will be described with reference to FIGS. 1 to 3C. FIG. 1 schematically shows the cross-sectional structure of the solid-state imaging apparatus 100. The solid-state imaging apparatus 100 includes a plurality of pixels P, includes a substrate 1, optical system 20, and light absorbing portions 30, and has a back-side illumination structure. For descriptive convenience, two pixels P ($P_{G/R}$ and $P_B$) will be exemplified.

The substrate 1 has a first face S1 and second face S2 which oppose each other, and includes a plurality of photoelectric conversion portions PD formed in correspondence with the plurality of pixels P. For example, the substrate 1 is made of silicon containing a p-type impurity, and each photoelectric conversion portion PD is formed by doping an n-type impurity into the substrate 1. In the substrate 1, for example, MOS transistors for reading out pixel signals from the corresponding photoelectric conversion portions PD are provided. FIG. 1 shows gate oxide films 2 and gate electrodes 3 of the MOS transistors. The gate oxide film 2 is made of, for example, $SiO_2$. The gate electrode 3 is made of, for example, polysilicon. An insulation portion 6 (interlayer dielectric layer) is provided on the gate oxide films 2 and gate electrodes 3 by depositing an insulation member, and a wiring pattern (not shown) for power supply or signal transmission can be arranged within the insulation portion 6.

An optical system 20 includes a plurality of microlenses ML which are provided below the first face (S1) of the substrate 1 in correspondence with the pixels P. The optical system 20 also includes color filters 10 ($10_{G/R}$ and $10_B$) so that the plurality of pixels P can detect light components of different wavelengths. The plurality of pixels P include a pixel $P_{G/R}$ of a first type for detecting light of a first wavelength, and a pixel $P_B$ of a second type for detecting light of a wavelength shorter than the first wavelength. In this embodiment, red light ($\lambda_R$=about 610 to 780 [nm]) or green light ($\lambda_G$=about 500 to 570 [nm]) will be exemplified as light of the first wavelength, and blue light ($\lambda_B$=about 430 to 480 [nm]) will be exemplified as light of the second wavelength.

The pixel $P_{G/R}$ represents a pixel for which the color filter $10_{G/R}$ is arranged, and the pixel $P_B$ represents a pixel for which the color filter $10_B$ is arranged. The color filter $10_{G/R}$ transmits red or green light, and the color filter $10_B$ transmits blue light. That is, the pixel $P_{G/R}$ detects green or red light of a long wavelength ($\lambda_{G/R}$), and the pixel $P_B$ detects blue light of a short wavelength ($\lambda_B$). Furthermore, the optical system 20 may include a planarizing layer 9 made of a material which transmits light, and can be formed to planarize the back side of the substrate 1.

The light absorbing portion 30 includes a member for absorbing light, and is provided above the second face (S2) in correspondence with each pixel P. The light absorbing portion 30 can be provided within the insulation portion 6. The light absorbing portion 30 may be formed by, for example, stacking two members; it can sequentially include, from a near side with respect to the substrate 1, a portion 8 including a member for absorbing light and a metal portion 7 including a member having a conductive property. The light absorbing portion 30 can be provided in, for example, a wiring layer in which a wiring pattern for signal transmission is arranged. The metal portion 7 may be a wiring pattern including a metal member made of, for example, aluminum or copper, and can form a signal line for a control signal or for reading out a signal. The portion 8 may be provided as a layer for preventing, using TiN (titanium nitride), atoms of the metal portion 7 from diffusing.

The solid-state imaging apparatus 100 also includes a first portion 41 and a second portion 42. The first portion 41 is arranged between the light absorbing portion 30 and the substrate 1 in each pixel $P_{G/R}$. The second portion 42 is arranged between the light absorbing portion 30 and the substrate 1 in each pixel $P_B$. The first portion 41 is provided so as to have a reflectance for red or green light, which is larger than that of the second portion 42. The first portion 41 includes a dielectric film 4 (first dielectric film) having a dielectric property, a high refractive index film 5 (second dielectric film) having a dielectric property, and the insulation portion 6 from the side of the substrate 1 to the side of the light absorbing portion 30. On the other hand, the second portion 42 includes the dielectric film 4 and insulation portion 6 from the side of the substrate 1 to the side of the light absorbing portion 30. That is, the high refractive index film 5 is arranged not in the pixel $P_B$ but in the pixel $P_{G/R}$.

The dielectric film 4 has a refractive index lower than that of the substrate 1. The high refractive index film 5 has a refractive index higher than that of the dielectric film 4. The insulation portion 6 has a refractive index lower than that of the substrate 1. The refractive index of the insulation portion 6 is equal to or lower than that of the dielectric film 4. The dielectric film 4 and high refractive index film 5 are preferably provided so as to have optical thicknesses each falling within the range of ±30% of ¼ of the wavelength of red or green light. Each optical thickness preferably falls within the range of ±20% of ¼ of the wavelength, or more preferably falls within the range of ±10% of ¼ of the wavelength. More specifically, the dielectric film 4 need only be made of, for example, $Si_3N_4$ (a refractive index of about 1.9 to 2.2), and have a film thickness of about 50 to 80 nm. The high refractive index film 5 need only be made of, for example, polysilicon (a refractive index of 3.9 to 4.2), and have a film thickness of about 30 to 45 nm. The insulation portion 6 need only include, for example, a dielectric member made of $SiO_2$ or the like (a refractive index of 1.4 to 1.5), and have a thickness of 400 to 1000 nm (or may have a thickness of 1000 nm or larger). The above-described arrangement makes it possible to design the apparatus so that the reflectance of the first portion 41 for the red or green light is higher than that of the second portion 42.

The operation and effect of the arrangement of the solid-state imaging apparatus 100 will be described below with reference to FIG. 2. Let n1 be the refractive index of the substrate 1, n4 be the refractive index of the dielectric film 4, d4 be the thickness of the dielectric film 4, n5 be the refractive index of the high refractive index film 5, d5 be the thickness of the high refractive index film 5, and n6 be the refractive index of the insulation portion 6. In this embodiment, a case in which relationships n1>n4>n6, n5>n4, and n5>n6 hold will be explained. Note that an extinction coefficient k (the imaginary component of a complex refractive index) by a material for absorbing light is sufficiently smaller than the real component.

The substrate of a back-side illumination solid-state imaging apparatus generally has a thickness smaller than that of the substrate of a front-side illumination solid-state imaging apparatus; it has, for example, a thickness of about 3 µm. In the solid-state imaging apparatus 100, therefore, red or green light of a long wavelength of light incident from the first face S1 of the substrate 1 can reach the second face S2 of the substrate 1. In this example, mixed-color light of the wavelength $\lambda_{G/R}$ when light which becomes perpendicularly incident on the pixel $P_{G/R}$ mixes in the adjacent pixel $P_B$ will be described.

Figure 2:
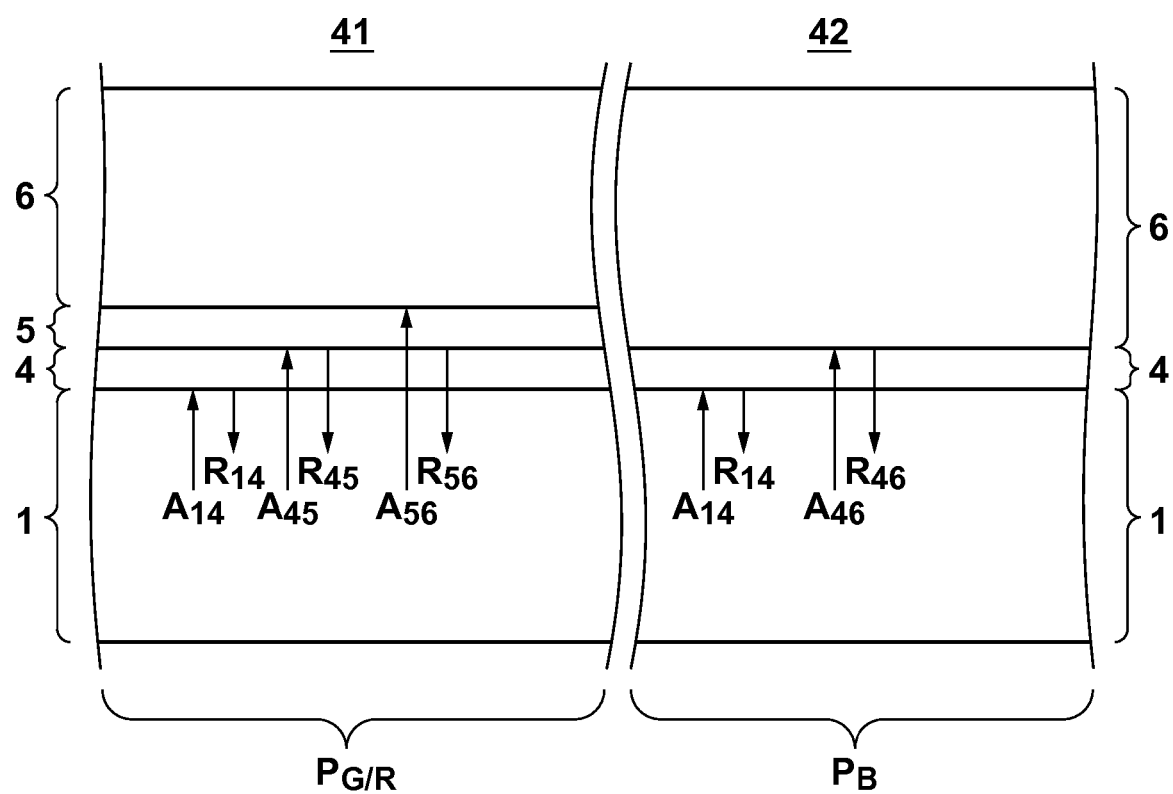
FIG. 2 is a view for explaining effects obtained in the arrangement of the solid-state imaging apparatus according to the first embodiment.

FIG. 2 is an enlarged view showing the first portion 41 and second portion 42 for explaining reflection or transmission of light which is incident from the first face S1 and reaches the second face S2. Let $A_{14}$ be the amplitude of a transmitted wave which has reached an interface $S_{14}$ between the substrate 1 and the dielectric film 4 from the substrate 1, and $R_{14}$ be the reflected wave component of light reflected by the interface $S_{14}$ toward the substrate 1. Let $A_{45}$ be the amplitude of a transmitted wave which reaches an interface $S_{45}$ between the dielectric film 4 and the high refractive index film 5 from the dielectric film 4, and $R_{45}$ be the reflected wave component of light reflected by the interface $S_{45}$ toward the dielectric film 4. Let $A_{56}$ be the amplitude of a transmitted wave which reaches an interface $S_{56}$ between the high refractive index film 5 and the insulation portion 6 from the high refractive index film 5, and $R_{56}$ be the reflected wave component of light reflected by the interface $S_{56}$ toward the high refractive index film 5. Furthermore, let $A_{46}$ be the amplitude of a transmitted wave which reaches an interface $S_{46}$ between the dielectric film 4 and the insulation portion 6 from the dielectric film 4, and $R_{46}$ be the reflected wave component of light reflected by the interface $S_{46}$ toward the dielectric film 4. Note that the interface $S_{45}$ and the like will representatively be referred to as an "interface S".

If the reflected wave reaches a low refractive index member from a high refractive index member, and is then reflected by the low refractive index member, no phase shift occurs. On the other hand, if the reflected wave reaches a high refractive index member from a low refractive index member and is then reflected by the high refractive index member, a phase shift of 180° occurs. This can be represented by $R_{14}=A_{14}\times(n1-n4)/(n1+n4)>0$ using a Fresnel equation. Similarly, it is possible to obtain $R_{45}=A_{45}\times(n4-n5)/(n4+n5)<0$, $R_{56}=A_{56}\times(n5-n6)/(n5+n6)>0$, and $R_{46}=A_{46}\times(n4-n6)/(n4+n6)>0$. For the sake of simplicity, assume that $A_{45}=A_{56}=A_{46}=A_{14}$. This assumption (or approximation) holds when the reflectance of each interface S is sufficiently smaller than 1, and is appropriate in the structure according to this embodiment.

The pixel $P_B$ shown on the right side of FIG. 2 will be explained. Light (a wavelength $\lambda_B$) perpendicularly incident on the pixel $P_B$ from the first face S1 is absorbed by the substrate 1 by almost 100%. On the other hand, mixed-color light (a wavelength $\lambda_{G/R}$) from the pixel $P_{G/R}$ can reach the second face S2. If it is designed to satisfy $n4=(n1\times n6)^{1/2}$ under a condition for effectively preventing reflection of light, $R_{14}=R_{46}$. If it is designed to satisfy $d4>n4=\lambda_{G/R}/4$, that is, d4 indicates an optical path length ¼ of the wavelength $\lambda_{G/R}$, the phase of the light reflected by the interface $S_{46}$ shifts by 180° upon returning to the interface $S_{14}$. Therefore, these reflected light components have opposite signs to cancel each other, and the second portion 42 transmits the mixed-color light (the wavelength $\lambda_{G/R}$). In fact, it is difficult to satisfy $n4=(n1\times n6)^{1/2}$. By designing to satisfy $n1>n4>n6$ and $d4\times n4=\lambda_{G/R}/4$, however, the reflected light components $R_{14}$ and $R_{46}$ cancel each other. In this way, the second portion 42 prevents reflection of the light of the wavelength $\lambda_{G/R}$ to transmit the light.

The pixel $P_{G/R}$ shown on the left side of FIG. 2 will be explained next. If the refractive indices of the substrate 1, dielectric film 4, and high refractive index film 5 have relationships n1>n4 and n5>n4, the components $R_{14}$ and $R_{45}$ have opposite signs. The reflected light component $R_{45}$ is smaller than 0, and a phase shift of 180° has occurred. Furthermore, it is designed to satisfy d4×n4=$\lambda_{G/R}$/4. These two reflected light components thus strengthen each other. If it is designed that the thickness of the high refractive index film 5 is d5×n5=$\lambda_{G/R}$/4, that is, d5 indicates an optical path length ¼ of the wavelength $\lambda_{G/R}$, the phase of the reflected light component $R_{56}$ at the interface $S_{56}$ shifts by 360° upon reaching the interface $S_{14}$. As a result, three reflected light components strengthen one another. In this way, the first portion 41 reflects the light of the wavelength $\lambda_{G/R}$.

By increasing the refractive index n5 of the high refractive index film 5, it is possible to increase the above-described reflection efficiency. Although, for example, polysilicon can be used for the high refractive index film 5, the dopant density in polysilicon is preferably adjusted (for example, $1×10^{19}$ [cm$^{-3}$] or lower) to decrease a light absorption amount by polysilicon.

Figure 3A:
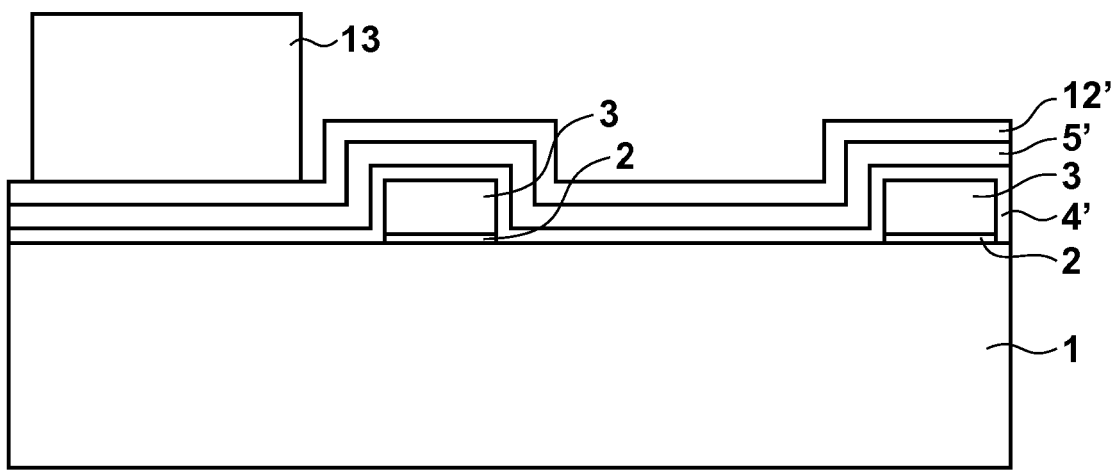
FIGS. 3A to 3C are views for explaining part of an example of a method of manufacturing the solid-state imaging apparatus according to the first embodiment.
Figure 3B:
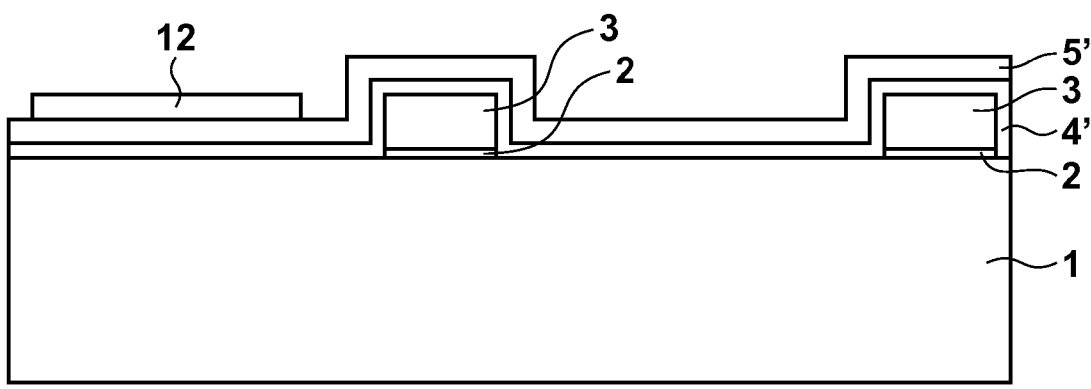
Figure 3C:
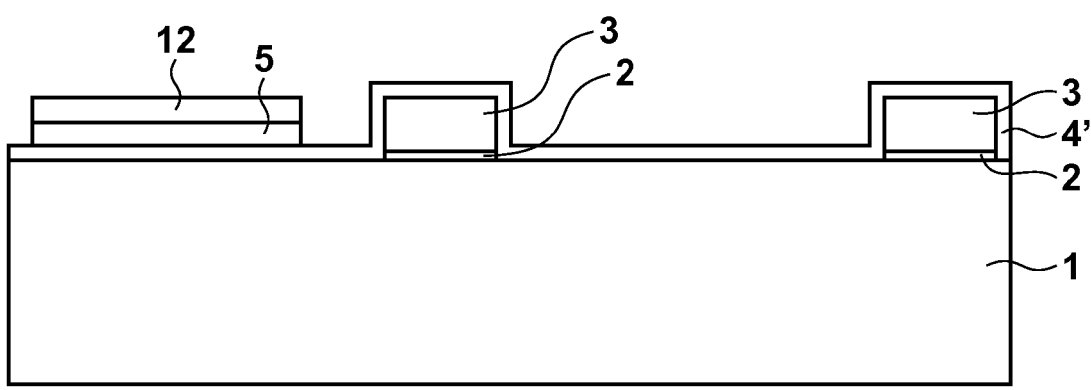

FIGS. 3A to 3C are views for explaining a method of manufacturing the solid-state imaging apparatus 100. FIG. 3A shows a structure obtained by forming gate oxide films 2 and gate electrodes 3 on a substrate 1, depositing a dielectric member 4', polysilicon 5', and a dielectric member 12', and then forming a photoresist pattern 13. The dielectric member 4', polysilicon 5', and dielectric member 12' are sequentially formed to cover the entire surface of the substrate after forming the gate electrodes 3. After that, a photoresist is formed, and patterning is performed by a well-known semiconductor manufacturing process, thereby forming the photoresist pattern 13.

FIG. 3B shows a structure obtained by patterning the dielectric member 12' by etching using the photoresist pattern 13 as a mask, and forming a dielectric portion 12. FIG. 3C shows a structure obtained by patterning the polysilicon 5' by etching using the dielectric portion 12 as a mask, and forming the high refractive index film 5. After that, it is only necessary to form a wiring region including the insulation portion 6 and metal portion 7 by a well-known semiconductor manufacturing process. Although the same member as that of the insulation portion 6 may be used for the dielectric member 12' (or dielectric portion 12), the refractive index n12 is made at least smaller than the refractive index n5 of the high refractive index film 5. A case in which the dielectric portion 12 is used as a mask when patterning the polysilicon 5' has been exemplified. However, a resist pattern may be formed, similarly to a normal exposure process.

A case in which the refractive indices of the respective members in the pixel $P_B$ have a relationship n1>n4>n6, the refractive indices of the respective members in the pixel $P_{G/R}$ have relationships n1>n4 and n5>n4, and d4×n4=$\lambda_{G/R}$/4 and d5×n5=$\lambda_{G/R}$/4 are set has been described above. With this arrangement, the pixel $P_B$ transmits light (mixed-color light) of the wavelength $\lambda_{G/R}$, and the pixel $P_{G/R}$ reflects light (incident light) of the wavelength $\lambda_{G/R}$. This improves the light sensitivity in the pixel $P_{G/R}$, and reduces color mixing from the adjacent pixel in the pixel $P_B$.

The solid-state imaging apparatus 100 employs an arrangement in which transmitted mixed-color light is absorbed by the light absorbing portions 30 not to be reflected again by the substrate 1. For the light absorbing portion 30, the portion 8 may be provided to have a bottom area larger than that of the metal portion 7. This can prevent irregular reflection of light in the region of the insulation portion 6, thereby preventing stray light. For example, the portion 8 may be provided to cover the side surface of the metal portion 7.

As described above, it is only necessary to design the apparatus so that the dielectric film 4 and high refractive index film 5 have optical thicknesses each falling within the range of ±30% of ¼ of the wavelength of red or green light. The optical thickness may be changed according to the parameters of the structure, as needed. For example, the optical thickness may be adjusted to obtain an effect for obliquely incident light in consideration of the pitch of the pixel P and the thickness and refractive index of each constituent member.

Like this embodiment, the above-described structure can be formed using dielectric members and semiconductors such as the substrate 1, dielectric film 4, high refractive index film 5, and insulation portion 6. It is, therefore, possible to form the structure without using any metal member which may become a contamination source for the substrate 1. This can prevent metal from mixing in the surfaces of the photoelectric conversion portions PD, resulting in a reduction of noise due to a dark current. As described above, according to this embodiment, it is possible to improve the light sensitivity of the solid-state imaging apparatus 100, reduce color mixing, and reduce noise, which is advantageous in improving the quality of the solid-state imaging apparatus 100.

Second Embodiment

The second embodiment will be described below. In the first embodiment, a case in which the relationship n4>n6 holds has been described. However, an apparatus may be configured to have a relationship n4≤n6 using $SiO_2$ for a dielectric film 4. In this case, a solid-state imaging apparatus 100 does not prevent reflection, by an interface $S_{14}$, of mixed-color light (a wavelength $\lambda_{G/R}$) incident on a pixel $P_B$, and the transmittance of the mixed-color light at the interface $S_{14}$ is lower than that in the first embodiment. On the other hand, in a pixel $P_{G/R}$, the amplitudes of reflected light components $R_{14}$ and $R_{45}$ are larger than those in the first embodiment, and the effect of light reflection of incident light (the wavelength $\lambda_{G/R}$) by interfaces $S_{14}$ and $S_{45}$ is larger than that in the first embodiment. The structure according to this embodiment is preferable in that improvement of light sensitivity can be prioritized over reduction of color mixing due to obliquely incident light or stray light. This is preferable, for example, if the thickness of a substrate 1 is small, if it is desirable to improve the sensitivity for light of a longer wavelength, or if a measure against color mixing between adjacent pixels is additionally taken. In this embodiment, therefore, it is also possible to obtain the same effects as those in the first embodiment.

Although the two embodiments have been described above, the present invention is not limited to them, and can be changed, as needed, in accordance with the objects, states, applications, functions, and other specifications. Other embodiments can also practice the present invention. For example, in the first or second embodiment, the dielectric film 4 need not include one type of dielectric member, and may have a two-layer structure including two types of dielectric members, or a structure including three or more layers. In this case, it is only necessary to design the apparatus in terms of the total optical thickness of the dielectric film 4 having a structure including two (or three or more) layers, as described above. For the two-layer structure, it is possible to obtain the same effects as those in the first embodiment by setting a higher one ($n4_1$) of the refractive indices of the two types of members to have relationships $n4_1$<n1 and $n4_1$<n5, and setting an average refractive index $n4_{ave}$ to have a relationship $n4_{ave}$>n6. Furthermore, it is possible to obtain the same effects as those in the second embodiment by setting the refractive indices to have relationships $n4_1$<n1, $n4_1$<n5, and $n4_{ave}$<n6. As an actually often employed structure, the same material as that of the insulation portion 6 may be used as a member having a lower refractive index of the two types of members. The dielectric film 4 need only be formed after the gate electrode of each of the transistors formed in the respective pixels is formed.

In the first or second embodiment, a case in which the dielectric film 4 has a single-layer structure has been exemplified. Strictly speaking however, the dielectric film 4 has, for example, a two-layer structure including a gate oxide film made of $SiO_2$ and a dielectric member made of $Si_3N_4$ or the like. Nevertheless, the thickness of the gate oxide film is, for example, about several nm, which is sufficiently smaller than that of the dielectric film 4. Therefore, the thickness of the gate oxide film need not be considered in the above-described relationships.

Although the solid-state imaging apparatus included in a camera has been described above, the camera conceptually includes not only a device whose principal purpose is photographing but also a device (for example, a personal computer or portable terminal) additionally provided with a photographing function. The camera can include the solid-state imaging apparatus according to the present invention, which has been exemplified in the above embodiments, and a processing portion for processing a signal output from the solid-state imaging apparatus. The processing portion can include, for example, an A/D converter, and a processor for processing digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-237270, filed Oct. 26, 2012, which is hereby incorporated by reference herein in its entirety.

What is claimed is:

1. A solid-state imaging apparatus having a plurality of pixels, comprising:
    a substrate which has a first face and a second face opposite to the first face, and in which a plurality of photoelectric conversion portions respectively corresponding to the plurality of pixels are formed;
    an optical system which includes a plurality of microlenses provided on a side of the first face of the substrate in correspondence with the plurality of pixels; and
    a plurality of light absorbing portions which are provided on a side of the second face of the substrate in correspondence with the plurality of pixels and absorb light,
    wherein the plurality of pixels include pixels of a first type for detecting light of a first wavelength and pixels of a second type for detecting light of a second wavelength shorter than the first wavelength, and
    the solid-state imaging apparatus further comprises, for each of the pixels of the first type, a first portion between the substrate and the light absorbing portion corresponding to the pixel, and further comprises, for each of the pixels of the second type, a second portion between the substrate and the light absorbing portion corresponding to the pixel, and
    the first portion has a reflectance higher than that of the second portion for the light of the first wavelength.

2. The apparatus according to claim 1, wherein
    the first portion includes a first dielectric film, a second dielectric film, and an insulation portion from the substrate side to the light absorbing portion side,
    the second portion includes the first dielectric film and the insulation portion from the substrate side to the light absorbing portion side, and
    the first dielectric film has a refractive index lower than that of the substrate, the second dielectric film has a refractive index higher than that of the first dielectric film, the insulation portion has a refractive index lower than that of the second dielectric film, and an optical thickness of the first dielectric film and an optical thickness of the second dielectric film each fall within a range of ±30% of ¼ of the first wavelength.

3. The apparatus according to claim 1, wherein
    the light absorbing portion is formed by sequentially stacking a member for absorbing light, and a member having a conductive property from a near side with respect to the substrate, and a portion including the member for absorbing the light has a bottom area larger than that of a portion including the member having the conductive property.

4. The apparatus according to claim 3, wherein
    the portion including the member for absorbing the light covers a side surface of the portion including the member having the conductive property.

5. A camera comprising:
    a solid-state imaging apparatus according to claim 1; and
    a processor configured to process a signal output from the solid-state imaging apparatus.

6. A method of manufacturing a solid-state imaging apparatus having a plurality of pixels,
    the solid-state imaging apparatus including a substrate which has a first face and a second face opposite to the first face and in which a plurality of photoelectric conversion portions respectively corresponding to the plurality of pixels are formed, an optical system which includes a plurality of microlenses provided on a side of the first face of the substrate in correspondence with the plurality of pixels, and a plurality of light absorbing portions which are provided on a side of the second face of the substrate in correspondence with the plurality of pixels and absorb light, and
    the plurality of pixels including pixels of a first type for detecting light of a first wavelength and pixels of a second type for detecting light of a second wavelength shorter than the first wavelength,
    the method comprising:
    forming, for each of the pixels of the first type and the pixels of the second type, a first dielectric film having a dielectric property on the substrate;
    forming, for each of the pixels of the first type, a second dielectric film having a dielectric property on the first dielectric film; and
    depositing, for each of the pixels of the first type and the pixels of the second type, an insulation portion having an insulation property to cover the first dielectric film and the second dielectric film,
    wherein the first dielectric film has a refractive index lower than that of the substrate, the second dielectric film has a refractive index higher than that of the first dielectric film, the insulation portion has a refractive index lower than that of the second dielectric film, and an optical thickness of the first dielectric film and an optical thickness of the second dielectric film each fall within a range of ±30% of ¼ of the first wavelength.

* * * * *